(12) United States Patent
Gu et al.

(10) Patent No.: US 12,154,931 B2
(45) Date of Patent: Nov. 26, 2024

(54) IMAGE SENSOR STRUCTURE AND FORMATION METHOD THEREOF

(71) Applicants: SHANGHAI IC R&D CENTER CO., LTD., Shanghai (CN); CHENGDU IMAGE DESIGN TECHNOLOGY CO. LTD., Chengdu (CN)

(72) Inventors: Xueqiang Gu, Shanghai (CN); Ke Lu, Shanghai (CN); Yirui Zhao, Shanghai (CN)

(73) Assignees: SHANGHAI IC R&D CENTER CO., LTD., Shanghai (CN); CHENGDU IMAGE DESIGN TECHNOLOGY CO. LTD., Chengdu (CN)

( * ) Notice: Subject to any disclaimer, the term of this patent is extended or adjusted under 35 U.S.C. 154(b) by 388 days.

(21) Appl. No.: 17/775,600

(22) PCT Filed: Jul. 23, 2020

(86) PCT No.: PCT/CN2020/103756
§ 371 (c)(1),
(2) Date: May 10, 2022

(87) PCT Pub. No.: WO2021/103601
PCT Pub. Date: Jun. 3, 2021

(65) Prior Publication Data
US 2022/0415951 A1 Dec. 29, 2022

(30) Foreign Application Priority Data
Nov. 29, 2019 (CN) .......................... 201911197479.1

(51) Int. Cl.
*H01L 27/146* (2006.01)

(52) U.S. Cl.
CPC .. *H01L 27/14636* (2013.01); *H01L 27/14623* (2013.01); *H01L 27/1463* (2013.01); *H01L 27/14643* (2013.01); *H01L 27/14689* (2013.01)

(58) Field of Classification Search
CPC ......... H01L 27/14636; H01L 27/14623; H01L 27/1463; H01L 27/14643; H01L 27/14689
See application file for complete search history.

(56) References Cited

U.S. PATENT DOCUMENTS 10,165,211 B1 * 12/2018 Borthakur ............ H04N 25/633
2014/0239431 A1 * 8/2014 Miyashita ......... H01L 27/14629
257/432

(Continued)

*Primary Examiner* — Mohsen Ahmadi
(74) *Attorney, Agent, or Firm* — Bayramoglu Law Offices LLC

(57) ABSTRACT

The present invention disclosures an image sensor structure and a formation method thereof, wherein comprising: a pixel unit array, a peripheral circuit set at the periphery of the pixel unit array, and a composite shield structure around the pixel unit array and between the pixel unit array and the peripheral circuit, the composite shield structure comprises a light shield structure and a heat shield structure; wherein, the light shield structure comprises a metal isolation structure around the pixel unit array for isolating light emitted by the peripheral circuit, and the heat shield structure comprises a cavity set inside the metal isolation structure, the cavity is filled with a thermal isolation medium for preventing heat transfer to the pixel unit array. The present invention can avoid image quality deterioration and distortion caused by light and heat of the peripheral circuit of the image sensor.

10 Claims, 6 Drawing Sheets

(56) References Cited

U.S. PATENT DOCUMENTS

| | | | |
|---|---|---|---|
| 2015/0060966 A1* | 3/2015 | Lenchenkov | H01L 27/14623 |
| | | | 257/292 |
| 2017/0323912 A1* | 11/2017 | Lahav | H01L 27/14609 |
| 2019/0052823 A1* | 2/2019 | Jung | H04N 25/76 |

* cited by examiner

IMAGE SENSOR STRUCTURE AND FORMATION METHOD THEREOF

CROSS-REFERENCE TO RELATED APPLICATION

This application claims priority of International Patent Application Serial No. PCT/CN2020/103756, filed Jul. 23, 2020, which is related to and claims priority of Chinese Patent Application Serial No. CN201911197479.1, filed Nov. 29, 2019. The entirety of each of the above-mentioned patent applications is hereby incorporated herein by reference and made a part of this specification.

TECHNICAL FIELD

The disclosure relates to the technical field of image sensors, in particular to an image sensor structure and a formation method that can prevent light and heat of a circuit from influencing sensitivity of a pixel unit.

BACKGROUND

Image sensors refer to devices that converting optical signals into electrical signals, wherein large-scale commercial image sensor chips include two types: charge coupled device (CCD) image sensor chips and complementary metal oxide semiconductor (CMOS) image sensor chips. Compared with traditional CCD sensors, CMOS image sensors have characteristics of low power consumption, low cost and compatibility with CMOS processes, which are more and more widely used. Now the CMOS image sensors are not only used in consumer electronics fields such as miniature digital cameras (DSC), mobile phone cameras, video cameras and digital single-lens reflex (DSLR), but also in fields of automotive electronics, surveillance, biotechnology and medicine.

Please refer to FIG. 1 and FIG. 2, FIG. 1 is a schematic layout diagram of a conventional CMOS image sensor chip, and FIG. 2 is a schematic cross-sectional structure view along position A-B in FIG. 1. As shown in FIG. 1, center region of a chip is a densely arranged pixel unit array, which is responsible for converting optical signals into electrical signals; the pixel unit array is surrounded by various peripheral control and readout circuits, which comprising a column readout circuit, a line selection control circuit and other peripheral circuits. In a working process of the peripheral circuits, recombination of electron-hole pairs may occur and is accompanied by generation of photons, which is a circuit light phenomenon. A circuit heat phenomenon is due to a current passes through a conductor or a semiconductor in the peripheral circuits, a part of heat will be released, which increasing temperature of the chip. The light and heat phenomena of the peripheral circuits directly affect performances of the image sensor. wherein, the heat generated by the peripheral circuits will be transferred to the pixel unit array, which will cause increasing a dark current of the pixel unit; the photons generated by the peripheral circuits will cause an abnormal increase of the edge output signal of the pixel unit array and result in image distortion.

As shown in FIG. 2, since a silicon substrate 10 is a good thermal conductor and a back end dielectric layer 12 is a poor thermal conductor, there is an order of magnitude difference in thermal resistance between the two. Therefore, the heat generated by the peripheral circuits is mainly transferred in the silicon substrate 10, and finally reaches photodiodes 11 which are used for photoelectric conversion in a pixel unit, then the dark current of the pixel unit is increased which inducing performance degradation; The silicon substrate 10 and the back end dielectric layer 12 can transmit light, so the photons generated by the peripheral circuits transfer through the silicon substrate 10 and the back end dielectric layer 12 at the same time, and finally reach the photodiodes 11, which causes output value of the photodiodes at the edge of the pixel unit array to become abnormally large and the image distortion.

Therefore, there is a need to provide a new technology capable of preventing light and heat of the peripheral circuits from affecting the sensitivity of the pixel unit array.

SUMMARY

The purpose of the present invention is to overcome the above-mentioned defects in the prior art, and to provide an image sensor structure and a formation method to prevent deterioration and distortion of imaging quality caused by light and heat generated by peripheral circuits of the image sensor structure.

In order to achieve the above objective, the present invention adopts the following technical solution: an image sensor structure, wherein comprising: a pixel unit array, a peripheral circuit set at the periphery of the pixel unit array, and a composite shield structure around the pixel unit array and between the pixel unit array and the peripheral circuit, the composite shield structure comprises a light shield structure and a heat shield structure; wherein, the light shield structure comprises a metal isolation structure around the pixel unit array for isolating light emitted by the peripheral circuit, and the heat shield structure comprises a cavity set inside the metal isolation structure, the cavity is filled with a thermal isolation medium for preventing heat transfer to the pixel unit array.

Further, the pixel unit array and the peripheral circuit are set on a device silicon wafer, and the device silicon wafer comprises a silicon substrate and a back end dielectric layer set on the front side of the silicon substrate; the metal isolation structure comprises a hollow metal ring connected with a solid metal ring, the hollow metal ring is set in the silicon substrate and the inner hollow of the hollow metal ring forms the cavity, the solid metal ring is set in the back end dielectric layer.

Further, a shallow trench isolation around the pixel unit array and between the pixel unit array and the peripheral circuit, the hollow metal ring comprises a first hollow metal ring connected with a second hollow metal ring, the cavity comprises a first cavity set inside the inner hollow of the first hollow metal ring and a second cavity set inside the inner hollow of the second hollow metal ring, the first hollow metal ring is set in the shallow trench isolation.

Further, a first trench is set in the shallow trench isolation, the first hollow metal ring is set in the first trench, a second trench connected with the first trench is set in the silicon substrate, and the second hollow metal ring is set in the second trench.

Further, the solid metal ring comprises a circular contact hole and one or multiple circular metal interconnection layer which are around the pixel unit array.

Further, the metal layers of the multiple circular metal interconnection layer are connected by a circular via.

Further, the thermal isolation medium comprises air, nitrogen or helium.

Further, the pixel unit array comprises: photodiodes and control transistors set on the front side of the silicon substrate, and a pixel unit metal interconnection layer set in the back end dielectric layer; the peripheral circuit comprises: peripheral circuit transistors set on the front side of the silicon substrate, and a peripheral circuit metal interconnection layer set in the back end dielectric layer.

Further, the peripheral circuit comprises a column readout circuit and a row selection control circuit.

A formation method for an image sensor structure, wherein comprising following steps: providing a device silicon wafer which has a silicon substrate, forming photodiodes for photosensitive and control transistors in a pixel unit array on the front side of the silicon substrate, forming peripheral circuit transistors in a peripheral circuit around the pixel unit array, and forming a shallow trench isolation around the pixel unit array between the pixel unit array and the peripheral circuit; performing an isotropic dry etching or a wet etching process on a dielectric layer surrounded by the shallow trench isolation, and forming an first trench with an arc-shaped cross section in the dielectric layer; wherein, the inner opening of the formed first trench is larger than the openings at the upper and lower ends thereof; depositing the metal of the first hollow metal ring on the side wall of the first trench, and the metal of the first hollow metal ring is closed preferentially on the openings at the upper and lower ends of the first trench, then forming a first hollow metal ring inside the first trench and a first cavity inside the first hollow metal ring; forming a back end dielectric layer on the front side of the silicon substrate, and forming a conventional contact hole and one or multiple conventional metal interconnection layer in the back end dielectric layer; wherein, while forming the conventional contact hole and the one or multiple conventional metal interconnection layer, through layout design, a circular contact hole and one or multiple circular metal interconnection layer which are set to surround the pixel unit array are formed between the pixel unit array and the peripheral circuit, then forming a solid metal ring; providing a carrier silicon wafer, and inverting the device silicon wafer to bond with the carrier silicon wafer; thinning the back side of the silicon substrate; performing an isotropic dry etching or a wet etching process on the back side of the silicon substrate thinned, and forming a second trench with an arc-shaped cross section connected with the first hollow metal ring in the silicon substrate; wherein, the inner opening of the formed second trench is larger than the openings at the upper and lower ends thereof; depositing a metal of a second hollow metal ring on the side wall of the second trench, and the metal of the second hollow metal ring is closed preferentially on the openings at the upper and lower ends of the second trench, then forming a second hollow metal ring inside the second trench and a second cavity inside the second hollow metal ring, the second hollow metal ring and the second cavity inside, the first hollow metal ring and the first cavity inside, and the solid metal ring are connected in sequence to form a composite shield structure against light and heat.

It can be seen from the above technical scheme that the present invention forming the composite shield structure against light and heat which passes through the silicon substrate and the back end dielectric layer from top to bottom, which can effectively prevent light and heat of the peripheral circuit transferring to the pixel unit array. Wherein, the hollow metal ring in the silicon substrate, the shallow trench isolation and the solid metal ring in the back end dielectric layer can effectively prevent light propagation; the composite structure composed of the cavity of the hollow metal ring and the dielectric layer material in the shallow trench isolation can effectively block heat propagation, so as to effectively prevent the influence of the circuit lighting and heating on the pixel unit area.

DETAILED DESCRIPTION

Figure 1:
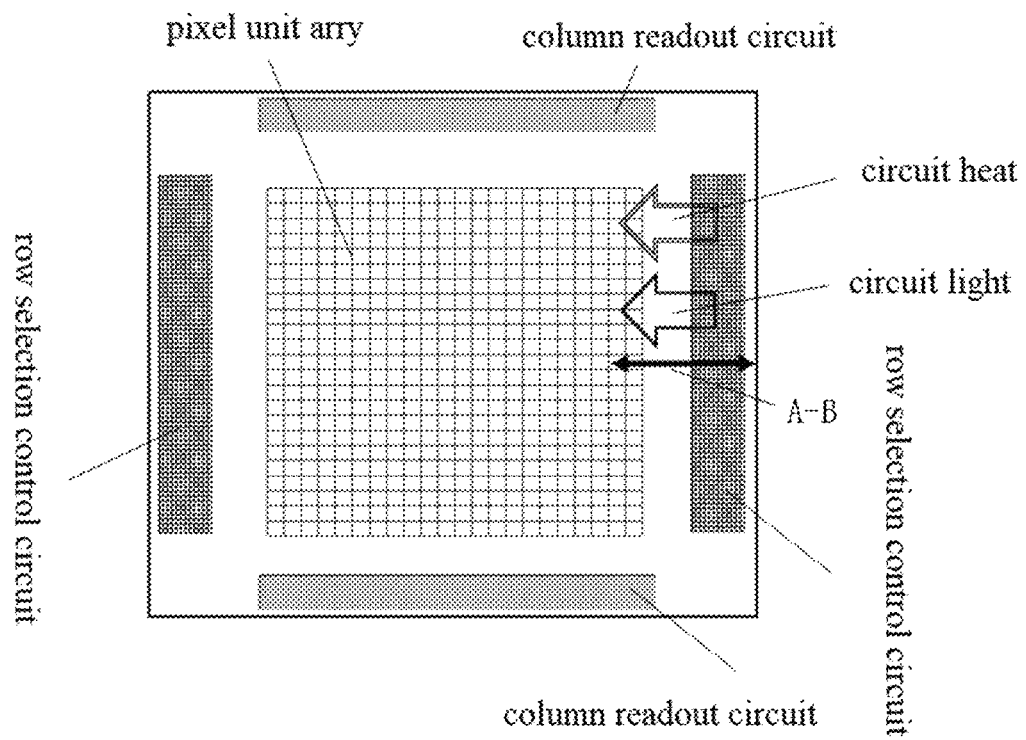
FIG. 1 is a schematic layout diagram of a conventional CMOS image sensor chip.
Figure 2:
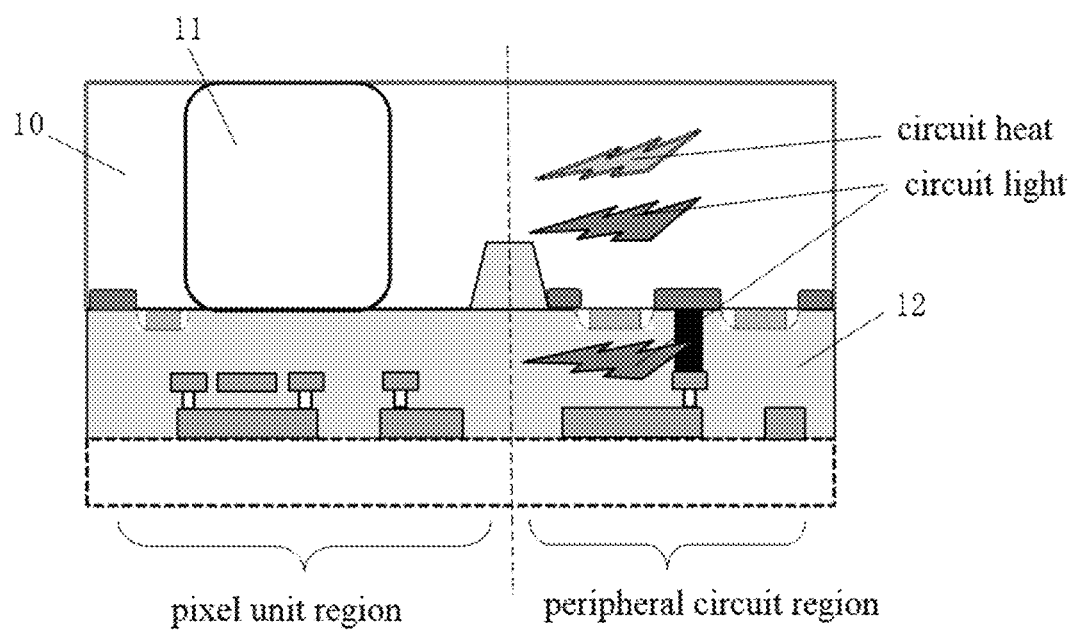
FIG. 2 is a schematic view of the cross-sectional structure along position A-B in FIG. 1.

In order to make the objectives, technical solutions and advantages of the present invention clearer, the specific embodiments of the present invention will be further described in detail below in conjunction with the accompanying drawings.

It should be noted that in the following specific embodiments, in detailing the embodiments of the present invention, in order to clearly show the structure of the present invention for ease of explanation, the structure in the drawings is not drawn in accordance with the general scale, and carried out partially enlarge, deform and simplify the process, it should be avoided as a limitation of the present invention.

Figure 3:
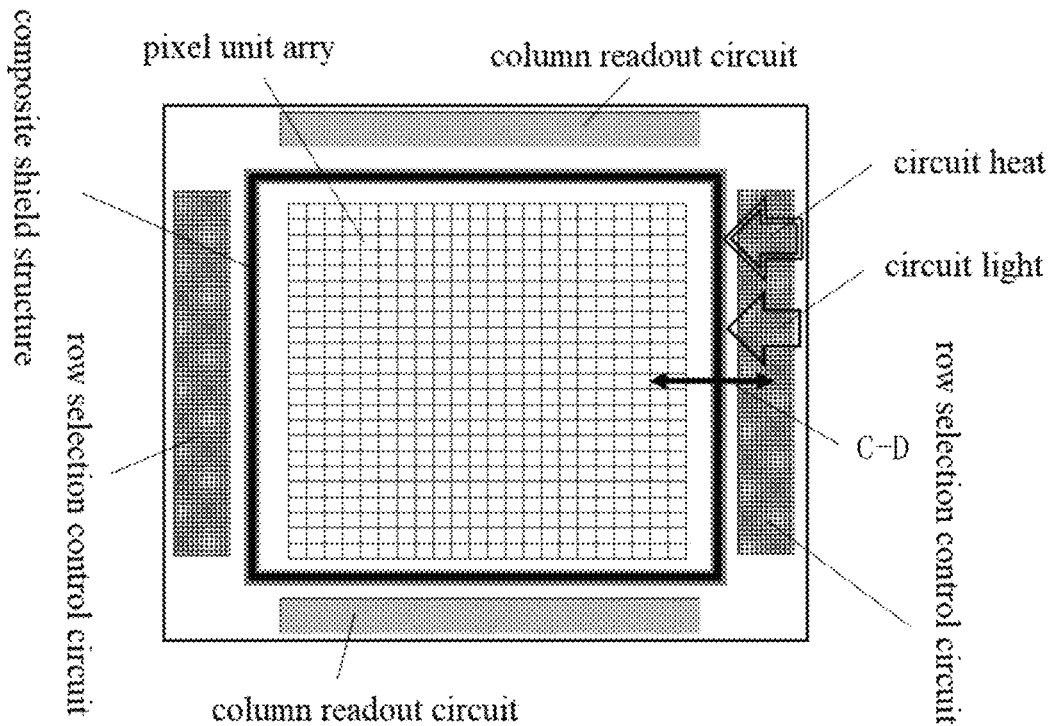
FIG. 3 is a schematic layout diagram of an image sensor chip according to a preferred embodiment of the present invention.
Figure 4:
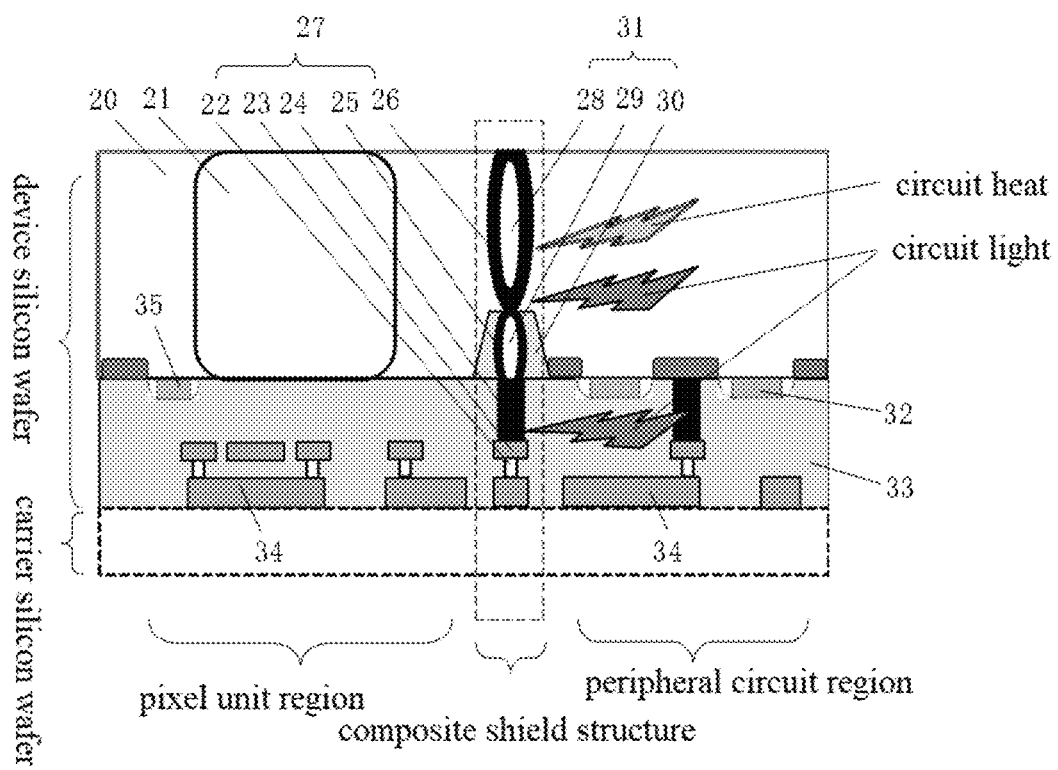
FIG. 4 is a schematic view of the cross-sectional structure along position C-D in FIG. 3.

In a following specific embodiment of the present invention, please refer to FIG. 3 and FIG. 4. FIG. 3 is a schematic layout diagram of an image sensor chip according to a preferred embodiment of the present invention. FIG. 4 is a schematic view of the cross-sectional structure along position C-D in FIG. 3. As shown in FIG. 3 and FIG. 4, the image sensor structure of the present invention can be set on a device silicon wafer and a carrier silicon wafer bonded up and down. The image sensor chip structure comprises a pixel unit region and a peripheral circuit region around the pixel unit region. Wherein, the pixel unit region is set with a pixel unit array, and the peripheral circuit region is set with peripheral circuits such as a column readout circuit and a row selection control circuit.

Please refer to FIG. 4. The pixel unit array and the peripheral circuits are set on the device silicon wafer; the device silicon wafer comprises a silicon substrate 20 and a back end dielectric layer 33 set on the front side of the silicon substrate 20. A carrier silicon wafer is bonded to the surface of the back end dielectric layer 33.

The pixel cell region (the pixel unit array) and the peripheral circuit region (the peripheral circuits) are isolated by a shallow trench isolation 30. The shallow trench isolation 30 is set on the silicon substrate 20 and around the pixel unit array to form a ring.

The pixel unit array can comprise photodiodes 21 and control transistors 35 which are set on the front side of the silicon substrate 20. The peripheral circuits can comprise peripheral circuit transistors 32 set on the front side of the silicon substrate 20. A metal interconnect layer 34 is set in the back end dielectric layer 33, which comprises a pixel unit metal interconnect layer and a peripheral circuit metal interconnect layer.

Please refer to FIG. 3 and FIG. 4. The outer part of the pixel unit array is surrounded by a circular composite shield structure surrounded by the peripheral circuits.

The composite shield structure comprises a light shield structure 27 and a heat shield structure 31. Wherein, the light shield structure 27 comprises metal isolation structures 22 to 26 around the pixel unit array; the metal isolation structures 22 to 26 are used to isolate the light emitted by the peripheral circuit.

According to design features and shielding requirements, the metal isolation structures 22 to 26 can be in a form of a continuous or discontinuous planar ring around the pixel unit array.

The heat shield structure 31 comprises cavities 28 and 29 set inside the metal isolation structures 22 to 26; the cavities 28 and 29 are filled with a thermal isolation medium to prevent heat transfer to the pixel unit array.

The thermal insulation media can comprise air, nitrogen, helium and other thermally poor conductors; other suitable gas or solid media can also be used.

Please refer to FIG. 4. The metal isolation structures 22 to 26 comprise hollow metal rings 25 to 26 connected with solid metal rings 22 to 24, Wherein, the hollow metal rings 25 to 26 are set in the silicon substrate 20, and the cavities 28 and 29 of the heat shield structure 31 are formed by the inner hollows of the hollow metal rings 25 to 26.

Further, the hollow metal rings 25 to 26 can comprise a first hollow metal ring 25 connected with a second hollow metal ring 26. Correspondingly, the cavities 28 and 29 also comprise a first cavity 29 set inside the inner hollow of the first hollow metal ring 25 and a second cavity 28 set inside the inner hollow of the second hollow metal ring 26. Wherein, the first hollow metal ring 25 is set to pass through the dielectric layer surrounded by the shallow trench isolation 30.

The solid metal rings 22 to 24 are set in the back end dielectric layer 33. The solid metal rings 22 to 24 can be formed by related metals that make the metal interconnect layer 34. For example, the solid metal rings 22 to 24 can comprise a circular contact hole 24 around the pixel unit array (which can be formed at the same time as the conventional contact hole 37) and one or multiple circular metal interconnection layer metal 23, such as a illustrated two-layer circular metal interconnection layer metal 23 (which can be formed at the same time as the conventional metal interconnection layer 34) and a circular via (which can be formed at the same time as the conventional via 38) for connecting the two-layer circular metal interconnect layer metal 23.

Please refer to FIG. 4. As an alternative embodiment, a first trench 36 can be set in the dielectric layer surrounded by the shallow trench isolation 30 on the silicon substrate 20, and a first hollow metal ring 25 can be set in the first trench 36. Meanwhile, a second trench 39 connected with the first trench 36 is set in the silicon substrate 20, a second hollow metal ring 26 is set in the second trench 39 and connected with the first hollow metal ring 25. The first hollow metal ring 25 is then connected with the circular contact hole 24 in the back end dielectric layer 33.

In this way, the light shield structure 27 is formed by the second hollow metal ring 26, the first hollow metal ring 25 and the solid metal rings 22 to 24 connected in sequence, and the heat shield structure 31 is formed by the second cavity 28 inside the second hollow metal ring 26, the first cavity 29 inside the first hollow metal ring 25 and the shallow trench isolation 30, then the composite shield structure is formed to pass through the silicon substrate 20 and the back end dielectric layer 33 vertically.

Following describes in detail a method for forming an image sensor structure of the present invention through specific embodiments and the accompanying drawings.

Figure 5:
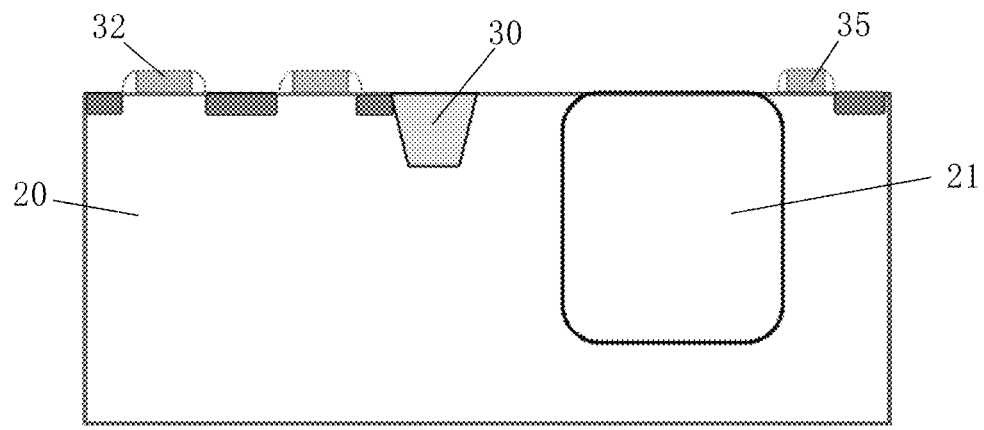
FIGS. 5 to 13 are schematic process steps of a formation method for an image sensor structure according to a preferred embodiment of the present invention.

Please refer to FIGS. 5 to 13, which are schematic process steps of an formation method for an image sensor chip structure according to a preferred embodiment of the present invention. As shown in FIGS. 5 to 13, the formation method can be used to form the image sensor chip structure described above in FIGS. 3-4, and can comprise following steps:

First, as shown in FIG. 5, by a conventional CMOS image sensor manufacturing process, the photodiodes 21 for photosensitive and the control transistors 35 are formed in the pixel unit array on the front side of the silicon substrate 20 of the device silicon wafer, the peripheral circuit transistors 32 in the peripheral circuits is formed around the pixel unit array, and the shallow trench isolation 30 around the pixel unit array is formed between the pixel unit array and the peripheral circuit, the shallow trench isolation 30 is used to isolate the pixel unit array and the peripheral circuit.

Figure 6:
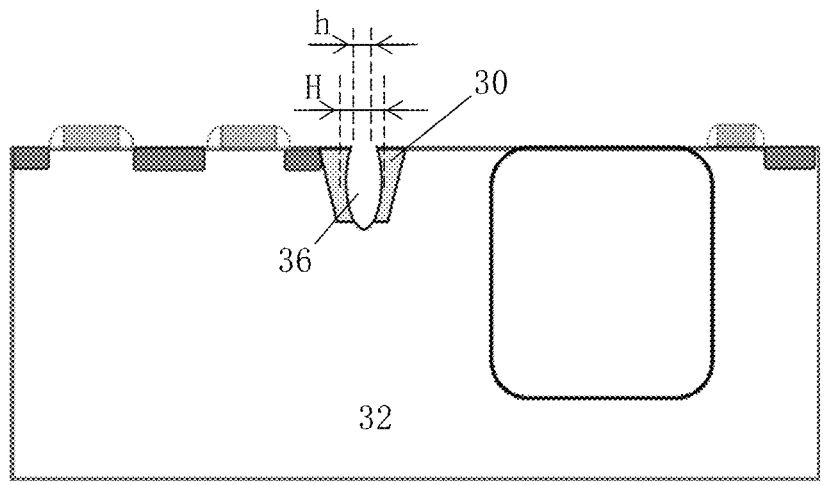

Next, as shown in FIG. 6, performing an isotropic dry etching or a wet etching process on the dielectric layer of the shallow trench isolation 30, so as to form the first trench 36 with an arc-shaped cross section in the dielectric layer surrounded by the shallow trench isolation 30. Wherein, by the isotropic dry etching or the wet etching process, the inner opening of the first trench 36 is formed larger than the openings h at the upper and lower ends of the first trench 36, which is similar to a beer barrel-shaped cross section.

Figure 7:
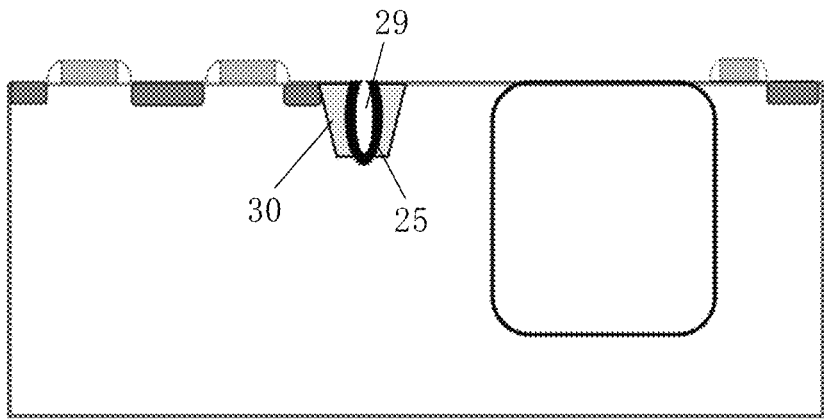

Subsequently, as shown in FIG. 7, filling a metal in the first trench 36, that is, depositing uniformly the metal of the first hollow metal ring 25 on the side wall of the first trench 36. Since the opening h at the top of the arc-shaped first trench 36 is smaller than the opening H inside the first trench 36, and the metal of the first hollow metal ring 25 is closed preferentially on the openings at the upper and lower ends of the first trench 36, then, a void is formed at the opening H, thereby forming the first hollow metal ring 25 inside the first trench 36. The void formed inside the first hollow metal ring 25 constitutes the first cavity 29 for heat shielding. Meanwhile, the first cavity 29 is filled with air, which is a poor conductor of heat, then it can prevent circuit heat from propagating from the silicon substrate 20 to the pixel unit array. Simultaneously, the metal of the first hollow metal ring 25 filled in the first trench 36 is opaque, such as metal tungsten, copper or aluminum, so influences of circuit light on the pixel unit can be shielded. Although the dielectric layer filled in the conventional shallow trench isolation 30 is not a good conductor of heat, due to the width of the shallow trench isolation 30 is small, thermal energy can still transfer to the pixel unit array. By forming a cavity isolation structure in the shallow trench isolation 30, since the thermal resistance of air is much greater than that of dielectric layer, the influence of the circuit heat can be better shielded.

Figure 8:
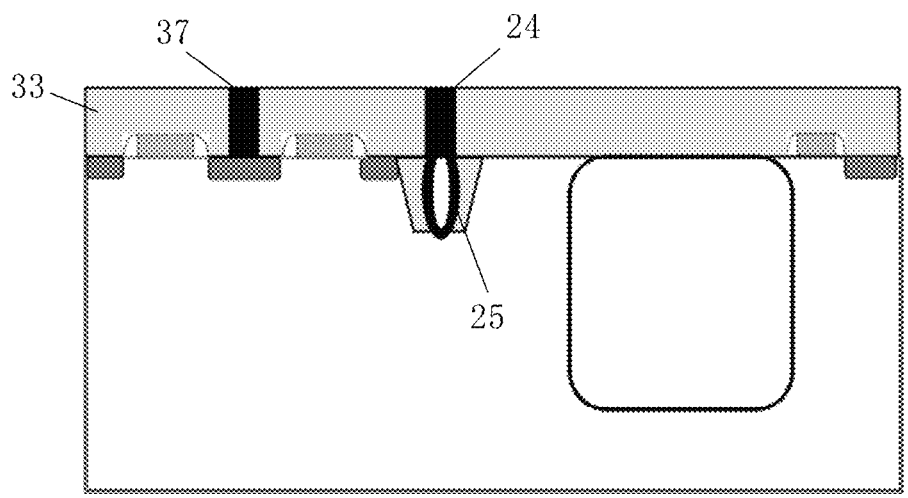

Next, as shown in FIG. 8, the back end dielectric layer 33 is formed on the front side of the silicon substrate 20; by contact hole processes of photolithography, etching and filling, and through layout design, the conventional contact hole 37 and the circular contact hole 24 around the pixel unit array is formed in the back end dielectric layer 33. A filling material in the conventional contact hole 37 and the circular contact hole 24 can be a metal material such as metal tungsten. Wherein, the position of the circular contact hole 24 is directly facing the upper end of the first trench 36 below, thus the etching process of the circular contact hole 24 can be stopped on the first hollow metal ring 25 in the first trench 36 to prevent overetching.

Figure 9:
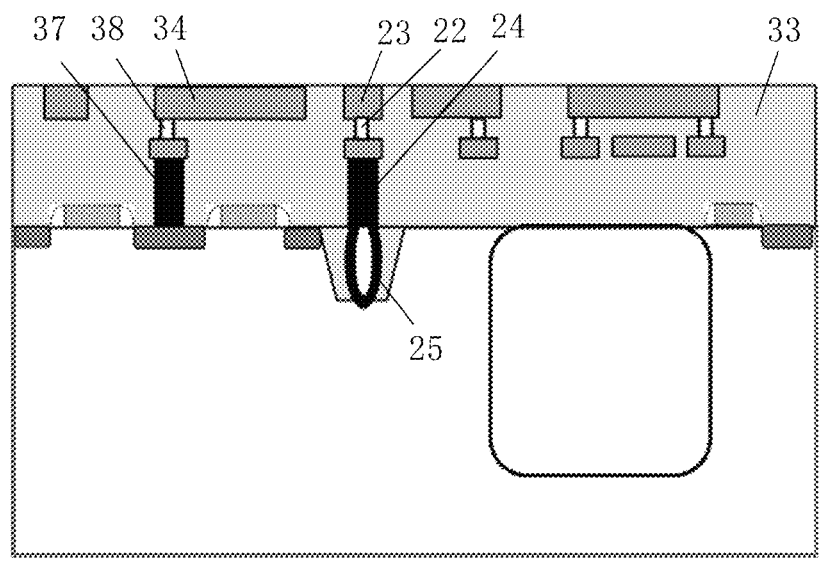

Next, as shown in FIG. 9, by a back-end metal interconnection process, and through layout design, a two-layer conventional metal interconnection layer 34, a conventional via 38, and the circular via 22 and the two-layer circular metal interconnection layer metal 23 which surround the pixel unit array are formed.

Wherein, the circular contact hole 24, the two-layer circular metal interconnection layer metal 23 and the circular via 22 are connected to form the solid metal rings 22 to 24. Since the back end dielectric layer 33 fully covers the silicon substrate 20, its lateral dimension is much larger than that of the shallow trench isolation 30, thus thermal energy cannot be effectively transferred from the peripheral circuit region to the pixel unit, a purpose of shielding in the back end dielectric layer 33 is mainly preventing light propagation.

Figure 10:
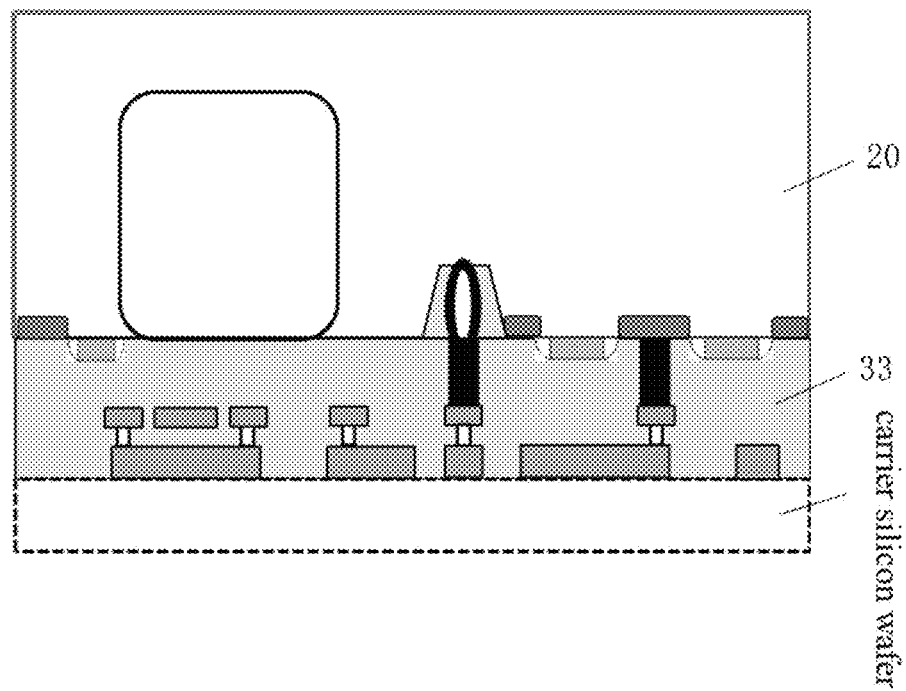

Subsequently, as shown in FIG. 10, inverting the device silicon wafer to bond with the carrier silicon wafer.

Figure 11:
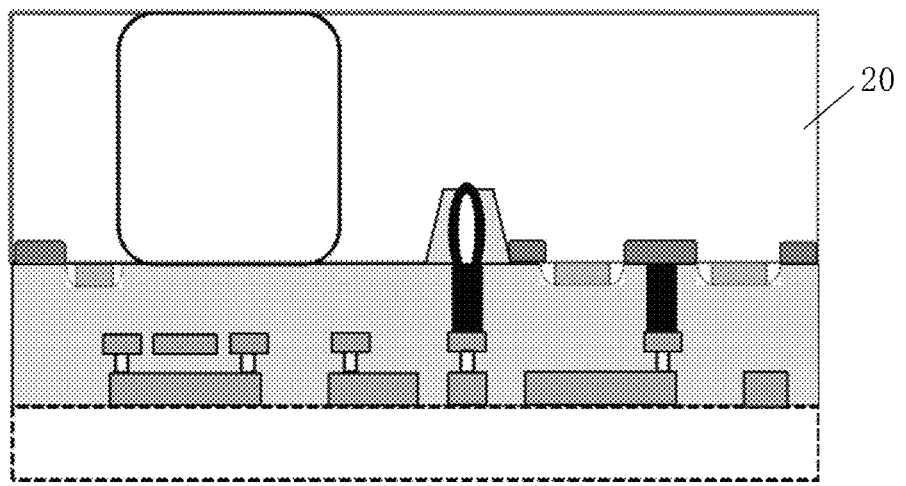

Then, as shown in FIG. 11, by a conventional backside illumination process, thinning the back side of the silicon substrate 20.

Figure 12:
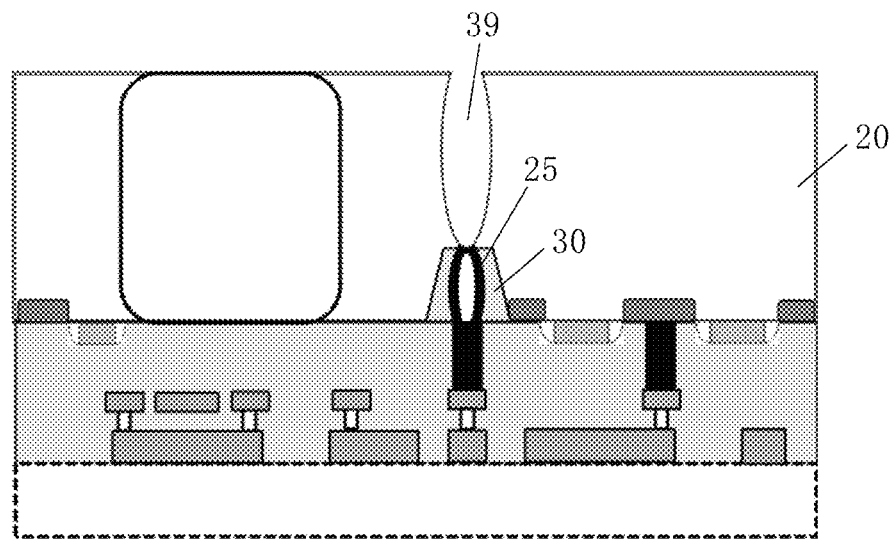

Next, as shown in FIG. 12, performing an isotropic dry etching or a wet etching process on the back side of the silicon substrate 20 thinned, so as to form the second trench 39 in the thinned silicon substrate 20 which is aligned up and down with the first trench 36 in the shallow trench isolation 30. Similarly, the inner opening of the formed second trench 39 is larger than the openings at the upper and lower ends thereof.

Figure 13:
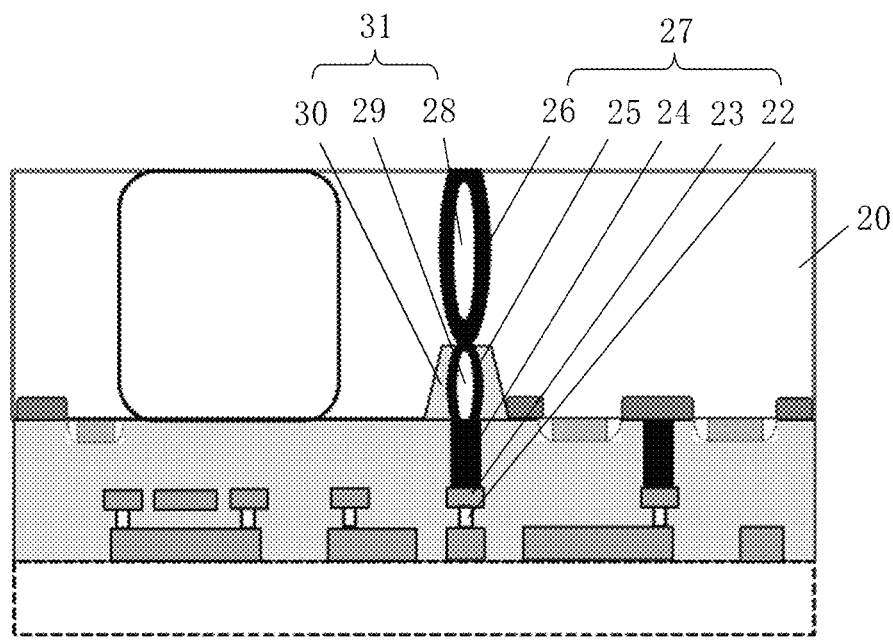

Subsequently, as shown in FIG. 13, filling a metal of the second hollow metal ring 26 in the second trench 39, that is, the second hollow metal ring 26 is uniformly deposited on the side wall of the second trench 39. Since the opening at the top of the arc-shaped second trench 39 is smaller than the opening inside the second trench 39, the metal of the second hollow metal ring 26 is closed preferentially at the openings at the upper and lower ends of the second trench 39, and a void is formed at the inner opening, thus forming the second hollow metal ring 26 inside the second trench 39. The void formed inside the second hollow metal ring 26 constitutes the second cavity 28 for heat shielding.

In this way, the second cavity 28, the first cavity 29 and the shallow trench isolation 30 constitute the heat shield structure 31; the second hollow metal ring 26, the first hollow metal ring 25, the circular contact hole 24 and the circular metal interconnection layer 23 (including the circular via 22) are connected in sequence to form the light shield structure 27; and then forming the composite shield structure against light and heat which passes through the silicon substrate 20 and the back end dielectric layer 33 from top to bottom.

The above descriptions are only the preferred embodiments of the present invention, and the described embodiments are not used to limit the scope of patent protection of the present invention. Therefore, any equivalent structural changes made using the contents of the description and drawings of the present invention should be included in the same reasoning within the protection scope of the appended claims of the present invention.

What is claimed is:

1. An image sensor structure, comprising: a pixel unit array, a peripheral circuit set at the periphery of the pixel unit array, and a composite shield structure around the pixel unit array and between the pixel unit array and the peripheral circuit, the composite shield structure comprises a light shield structure and a heat shield structure; wherein, the light shield structure comprises a metal isolation structure around the pixel unit array for isolating light emitted by the peripheral circuit, and the heat shield structure comprises a cavity set inside the metal isolation structure, the cavity is filled with a thermal isolation medium for preventing heat transfer to the pixel unit array.

2. The image sensor structure of claim 1, wherein the pixel unit array and the peripheral circuit are set on a device silicon wafer, and the device silicon wafer comprises a silicon substrate and a back end dielectric layer set on the front side of the silicon substrate; the metal isolation structure comprises a hollow metal ring connected with a solid metal ring, the hollow metal ring is set in the silicon substrate and the inner hollow of the hollow metal ring forms the cavity, the solid metal ring is set in the back end dielectric layer.

3. The image sensor structure of claim 2, wherein a shallow trench isolation around the pixel unit array and between the pixel unit array and the peripheral circuit, the hollow metal ring comprises a first hollow metal ring connected with a second hollow metal ring, the cavity comprises a first cavity set inside the inner hollow of the first hollow metal ring and a second cavity set inside the inner hollow of the second hollow metal ring, the first hollow metal ring is set in the shallow trench isolation.

4. The image sensor structure of claim 3, wherein a first trench is set in the shallow trench isolation, the first hollow metal ring is set in the first trench, a second trench connected with the first trench is set in the silicon substrate, and the second hollow metal ring is set in the second trench.

5. The image sensor structure of claim 2, wherein the solid metal ring comprises a circular contact hole and one or multiple circular metal interconnection layer which are around the pixel unit array.

6. The image sensor structure of claim 5, wherein the metal layers of the multiple circular metal interconnection layer are connected by a circular via.

7. The image sensor structure of claim 2, wherein the pixel unit array comprises: photodiodes and control transistors set on the front side of the silicon substrate, and a pixel unit metal interconnection layer set in the back end dielectric layer; the peripheral circuit comprises: peripheral circuit transistors set on the front side of the silicon substrate, and a peripheral circuit metal interconnection layer set in the back end dielectric layer.

8. The image sensor structure of claim 1, wherein the thermal isolation medium comprises air, nitrogen or helium.

9. The image sensor structure of claim 1, wherein the peripheral circuit comprises a column readout circuit and a row selection control circuit.

10. A formation method for an image sensor structure, comprising:
providing a device silicon wafer which has a silicon substrate, forming photodiodes for photosensitive and control transistors in a pixel unit array on the front side of the silicon substrate, forming peripheral circuit transistors in a peripheral circuit around the pixel unit array, and forming a shallow trench isolation around the pixel unit array between the pixel unit array and the peripheral circuit;
performing an isotropic dry etching or a wet etching process on a dielectric layer surrounded by the shallow trench isolation, and forming a first trench with an arc-shaped cross section in the dielectric layer;

wherein, the inner opening of the formed first trench is larger than the openings at the upper and lower ends thereof;

depositing the metal of the first hollow metal ring on the side wall of the first trench, and the metal of the first hollow metal ring is closed preferentially on the openings at the upper and lower ends of the first trench, then forming a first hollow metal ring inside the first trench and a first cavity inside the first hollow metal ring;

forming a back end dielectric layer on the front side of the silicon substrate, and forming a conventional contact hole and one or multiple conventional metal interconnection layer in the back end dielectric layer; wherein, while forming the conventional contact hole and the conventional metal interconnection layer, through layout design, a circular contact hole and one or multiple circular metal interconnection layer which are set to surround the pixel unit array are formed between the pixel unit array and the peripheral circuit, then forming a solid metal ring;

providing a carrier silicon wafer, and inverting the device silicon wafer to bond with the carrier silicon wafer;

thinning the back side of the silicon substrate;

performing an isotropic dry etching or a wet etching process on the back side of the silicon substrate thinned, and forming a second trench with an arc-shaped cross section connected with the first hollow metal ring in the silicon substrate; wherein, the inner opening of the formed second trench is larger than the openings at the upper and lower ends thereof;

depositing a metal of a second hollow metal ring on the side wall of the second trench, and the metal of the second hollow metal ring is closed preferentially on the openings at the upper and lower ends of the second trench, then forming a second hollow metal ring inside the second trench and a second cavity inside the second hollow metal ring, the second hollow metal ring and the second cavity inside, the first hollow metal ring and the first cavity inside, and the solid metal ring are connected in sequence to form a composite shield structure against light and heat.

* * * * *